United States Patent [19]

Morgan

[11] Patent Number: 4,862,189

[45] Date of Patent: Aug. 29, 1989

[54] MICROWAVE TRANSFORMER

[75] Inventor: Thomas E. Morgan, Greenford, England

[73] Assignee: The Marconi Company Limited, England

[21] Appl. No.: 254,472

[22] PCT Filed: Feb. 10, 1988

[86] PCT No.: PCT/GB88/00077

§ 371 Date: Oct. 24, 1988

§ 102(e) Date: Oct. 24, 1988

[87] PCT Pub. No.: WO86/06343

PCT Pub. Date: Aug. 25, 1988

[30] Foreign Application Priority Data

Feb. 11, 1987 [GB] United Kingdom ................ 8703065

[51] Int. Cl.[4] .......................... H01Q 1/36; H03H 7/42

[52] U.S. Cl. .................................... 343/859; 343/895; 333/26

[58] Field of Search ............... 343/895, 789, 821, 859, 343/862, 864; 333/26, 33

[56] References Cited

U.S. PATENT DOCUMENTS

| | | | |
|---|---|---|---|
| 3,019,439 | 1/1962 | Reis et al. | 343/895 |
| 3,786,372 | 1/1974 | Epis et al. | 333/26 |
| 4,636,802 | 1/1987 | Middleton | 343/895 |
| 4,658,262 | 4/1987 | DuHamel | 343/895 |

*Primary Examiner*—Rolf Hille
*Assistant Examiner*—Michael C. Wimer
*Attorney, Agent, or Firm*—Kirschstein, Ottinger, Israel & Schiffmiller

[57] ABSTRACT

A microwave balun transformer provides an extension of operating frequency range particularly in conjunction with a cavity-backed spiral antenna (5). The balun cavity (13) has a dipole (15,17) extending between an unbalanced coax port (19) and an opposite end wall (29), the dipole junction (16) being connected to a balanced twin line (7). The length of the cavity is effectively controlled to make it closer to (two) quarter-wave stubs by inserting a frequency dependent reflector (21) at each end of the dipole. At low frequencies the reflectors are transparent thus giving the full length of the cavity, while at high frequencies the reflectors reflect and effectively shorten the cavity.

5 Claims, 6 Drawing Sheets

INSERTION LOSS

MICROWAVE TRANSFORMER

BACKGROUND OF THE INVENTION

1. Field of the Invention

This invention relates to microwave 'balun' transformers, so called because of the transition they provide between balanced and unbalanced lines or systems.

2. Description of Related Art

A particular application of such transformers concerns cavity-backed antennas, in which, for example, a double spiral conductor mounted on a dielectric plate is backed by a cavity to take up power radiated backwards from the spiral. The cavity may be of such dimensions that a reflecting wall opposite to the spiral reflects the backward signal with such phase as to reinforce the forward transmission. Since such a design tends to limit the operating frequency it is known to absorb the reverse wave with a coating of absorbent material of some kind, e.g. graphite, to dissipate the reverse power rather than reflect it.

The spiral, or rather, double spiral, is fed by a balanced line, a twin pair, each of which is connected to a respective spiral termination.

It is known to mount the resulting cavity-backed antenna on a balun as shown in FIG. 1 of the accompanying drawings to convert the balanced twin line of the antenna feed to an unbalanced coaxial terminal port for connection to a transmitter/receiver. While the balun is satisfactory over a limited frequency range it is always desirable to extend the range of operation and/or generally improve the response.

SUMMARY OF THE INVENTION

It is therefore an object of the present invention to improve the frequency response of a microwave balun transformer, and particularly in use with a cavity-backed spiral antenna.

According to one aspect of the present invention, a microwave balun transformer comprises a dipole extending through a cavity formed between end walls of a conductive housing, at least one arm of the dipole comprising a coaxial line to a terminal port, the arms of the dipole being connected at their junction to the respective conductors of a balanced line which extends through the housing to provide a second terminal port, and a reflector being positioned close to each end of the dipole extending across the cavity transverse to the dipole arms, each reflector being substantially transparent at the frequency for which the length of each dipole arm is a quarter wavelength but being a substantial reflector at higher frequencies so that the effective length of each dipole arm remains closer to a quarter wavelength over a range of frequencies.

The reflector may comprise a conductive layer mounted on the front of a dielectric plate, the dielectric plate increasing the average permittivity of the cavity and thus reducing the frequency for which the effective length of each dipole arm is one half a wavelength. Each reflector may comprise an array of radial conductors extending from a conductive ring embracing the coaxial line.

A layer of radar absorbent material is preferably mounted on each end wall of the cavity to suppress the effect of imaging of the reflectors in the end walls.

According to another aspect of the invention, in a microwave antenna comprising a spiral conductor array mounted on a dielectric plate which in turn forms the closure to an antenna cavity, the cavity is mounted on the conductive housing of a transformer as aforesaid, the balanced line extending through the antenna cavity to feed the spiral array.

BRIEF DESCRIPTION OF THE DRAWINGS

A microwave balun transformer as incorporated in a cavity-backed spiral antenna, will now be described, by way of example, with reference to the accompanying drawings, of which.

DETAILED DESCRIPTION OF THE PREFERRED EMBODIMENTS

Figure 1:
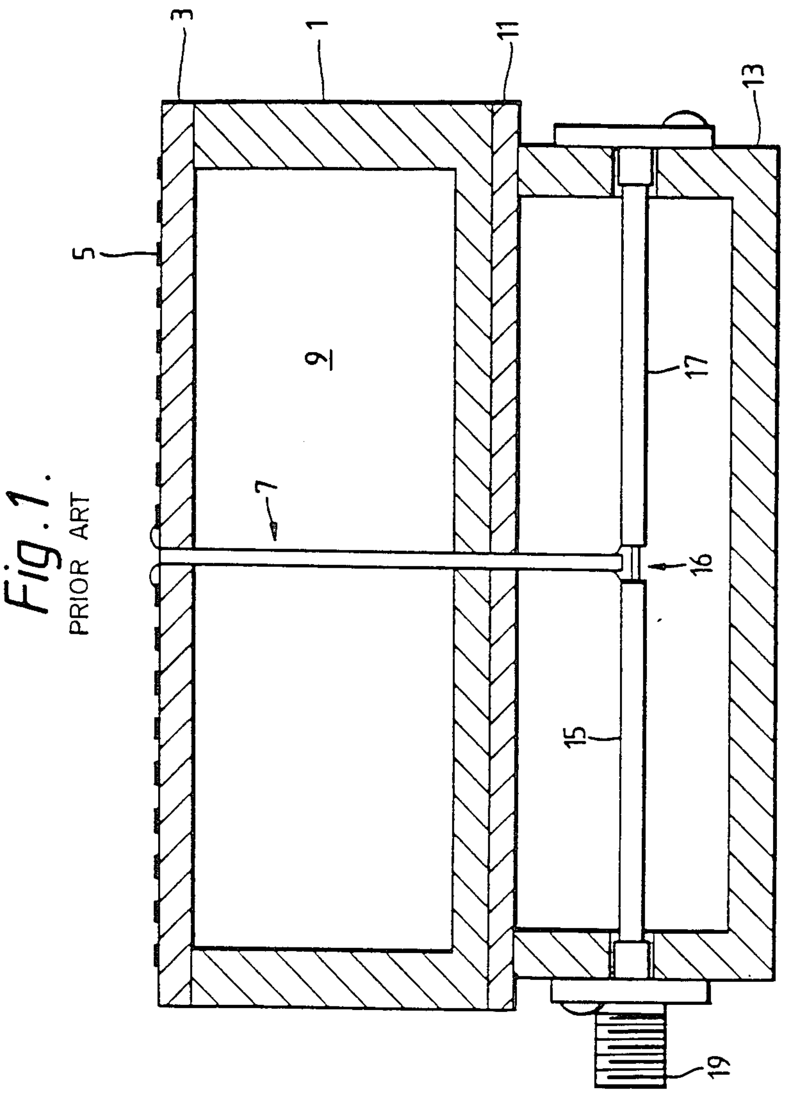
Fig. 1. PRIOR ART
FIG. 1 is a sectional elevation of a cavity-backed antenna and balun of conventional form according to the Prior Art.

Referring to FIG. 1, the cavity-backed antenna comprises (in this example) a square box-shaped housing 1 which is closed by an antenna plate 3 of dielectric material. The spiral antenna conductor 5 is etched on the surface of the plate 3 and comprises (in effect) a double wound square 'spiral' the inner ends of which are connected to the respective conductors of a twin line 7 which extends through the plate 3 and the cavity 9 formed by the housing 1.

The cavity housing 1 may be of metal, or of dielectric material with its outer surface metallised.

The cavity housing is mounted on a metal plate 11 which closes off a metal box 13 of square form. If the cavity housing 1 is of metal the plate 11 may be omitted, the base of the housing 1 then providing the metal closure to the box 13.

A dipole comprising arms 15 & 17 extends across the cavity of the box 13. The arm 15 consists of a coaxial line from the dipole junction 16 to a terminal port 19 while the arm 17 may be a coaxial line or a rod as in the example shown. The remote end of the rod 17 is connected to the box 13 to provide a short circuit. The conductors of the twin line 7 are connected one to the 'outer' of the coaxial line 15 and the other to the rod 17. The 'inner' of the coaxial arm 15 is also connected to the rod 17 at the junction 16. At the port 19, the 'outer' is connected to the box 13.

A microwave balun transformer is thus provided by the box 13 and its contents, between the balanced twin line 7 and the unbalanced terminal port 19.

In operation, as a transmitter, the antenna 5 is fed by way of the port 19, the coaxial line 15 and the balanced twin line 7. Power is radiated forwards (i.e., upwards in the Figure) and also backwards into the cavity 9 where it is largely dissipated.

In receiving, the signal at the junction 16 will see impedances to right and left depending upon the frequency. In the ideal case the arms 15 & 17 are each one quarter wavelength long. The rod 17 and enclosing box 13 then constitute, with the short-circuited termination, a short circuit quarter-wave stub, giving a high impedance at the input at junction 16. The signal therefore takes the alternative path to the 'inner' of line 15.

In the left hand half of the balun the port 19 provides a short circuit termination to the quarter wave stub formed by the 'outer' of line 15 and the box 13. The input impedance at the junction 16 is therefore very high and the signal again takes the path of the inner of coaxial line 15. This is all at the frequency, typically 3.5 GHz, for which the length of each dipole arm is a quarter wavelength, in which case a fairly efficient transformation between the balanced line 7 and the coaxial line 15 and port 19 is achieved.

Figure 4:
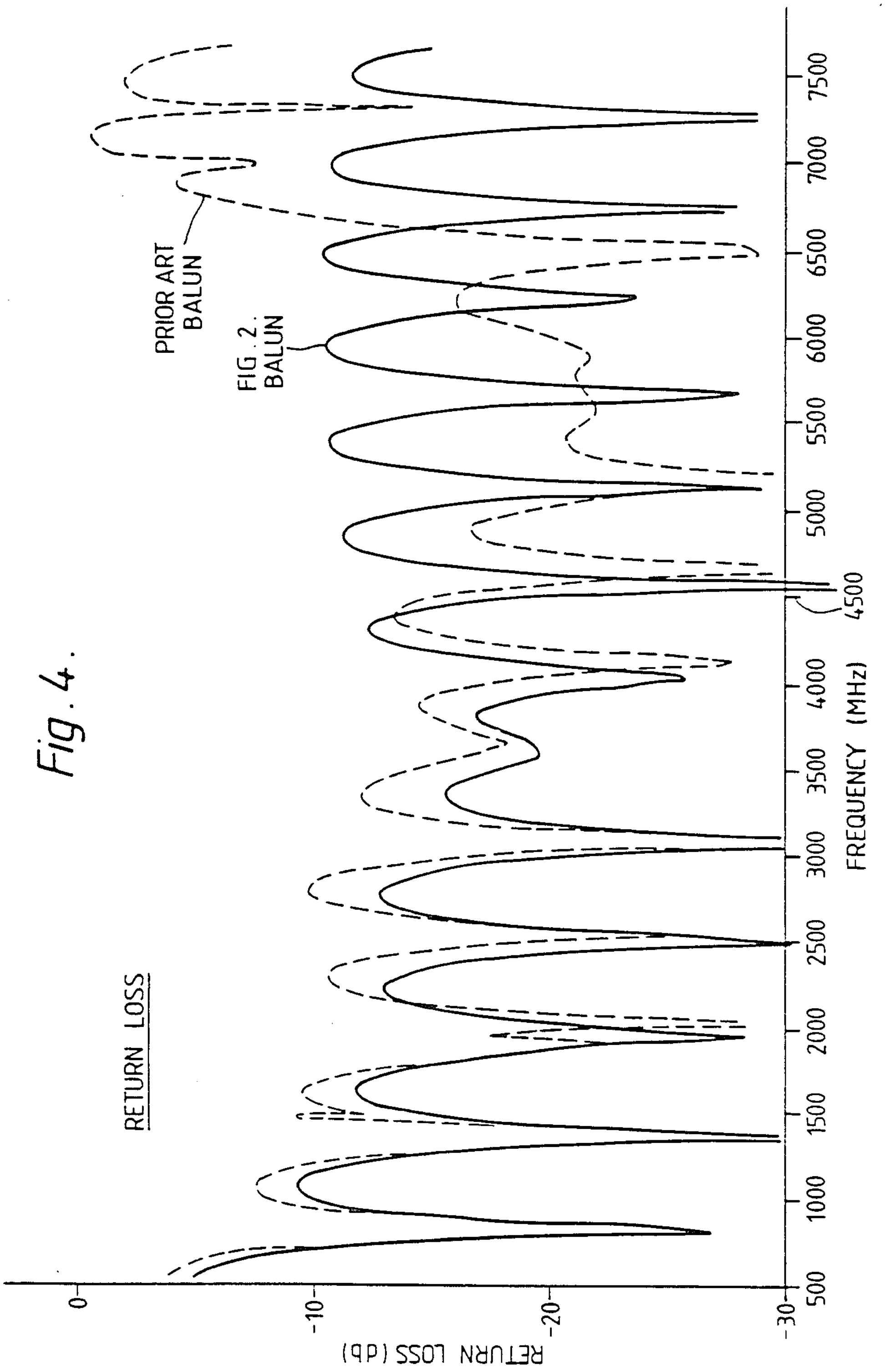
FIG. 4 shows return loss characteristics for the conventional balun of FIG. 1 and the improved balun of FIG. 2.
Figure 5:
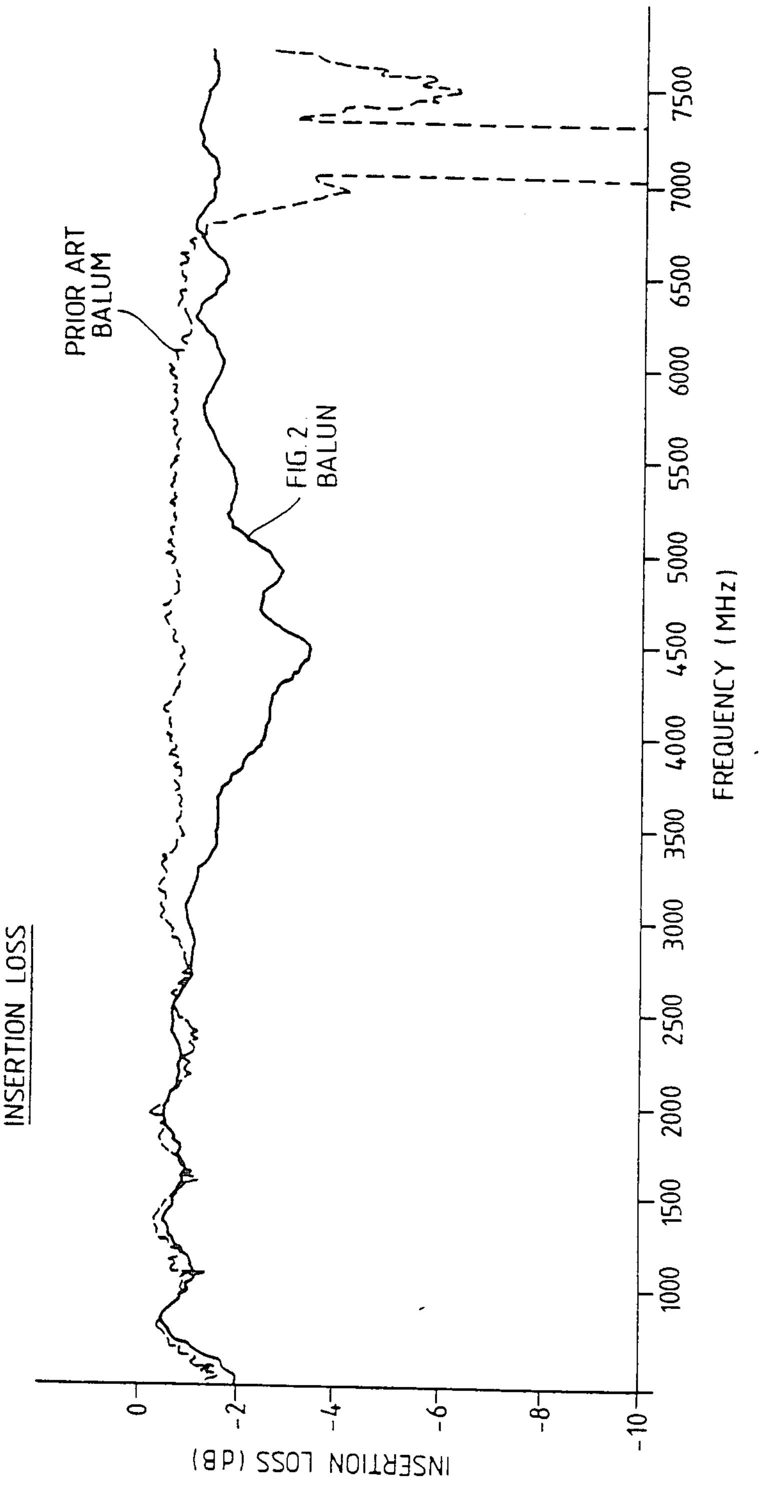
FIG. 5 shows insertion loss characteristics for the two designs.

However, as the operating frequency increases, the length of the arms 15 & 17 exceeds a quarter wavelength: mismatches occur until, at the frequency, 7 GHz, at which the length of each arm of the balun is half a wavelength, the transition exhibits a considerable mis-match. The insertion loss (output power as a proportion of input power) and return loss (reflected power as a proportion of input power) for a typical balun assembly of the kind shown in FIG. 1, are shown in FIGS. 5 & 4 respectively. It may be seen that while the losses in a central range around 3.5 GHz are satisfactorily low, at frequencies toward 0.7 GHz and 7 GHz the losses increase rapidly.

Figure 2:
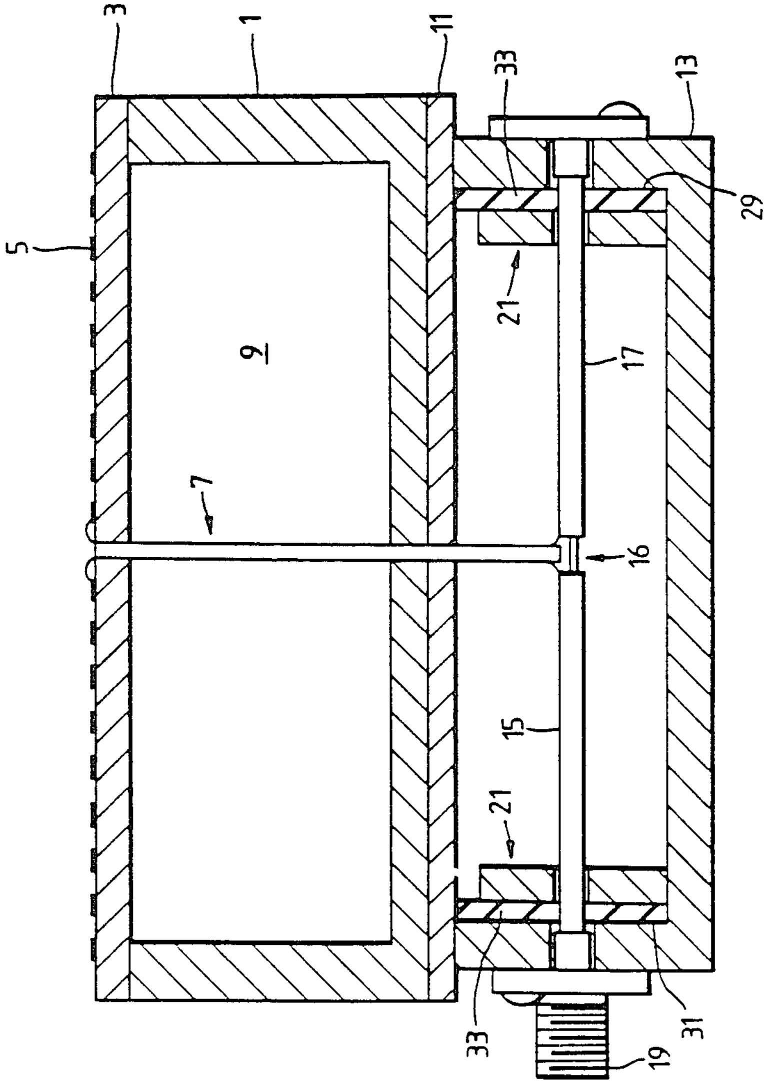
FIG. 2 corresponds to FIG. 1, modified by the addition of two reflectors shown in FIG. 3.
Figure 3:
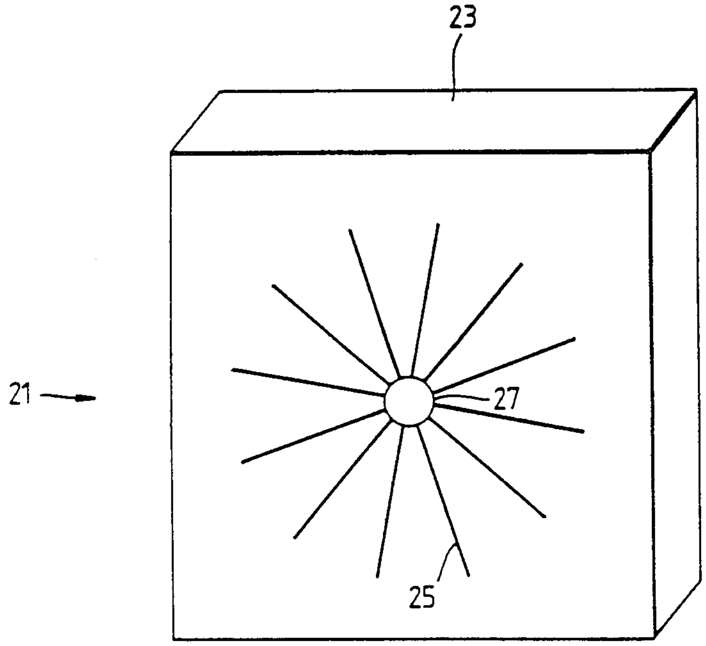
FIG. 3 is a perspective diagram of an auxiliary reflector used to modify the conventional design.

Extension of the operating frequency band is achieved in the embodiment shown in FIG. 2. The spiral antenna 5, cavity 9 and basic balun construction are as in FIG. 1. However, an auxiliary reflector 21 is included at each end of the dipole, the reflector being shown in more detail in FIG. 3. It consists of a square dielectric plate 23 of "Stycast" having a relative permittivity of 3. A conductor layer in the form of an array 25 of conductors radiating from a central ring 27 is formed on the surface by deposition and etching, the ring 27 surrounding a hole which embraces, without quite touching, the respective arm of the dipole, as shown in FIG. 2.

In this particular example the 'diameter' of the radial array is 9 millimeters, each leg of the array is 0.5 millimeters wide and the central hole is 1.25 millimeters diameter. The plate 23 is 12.4 millimeters square and 3.9 millimeters thick. The result is a resonance frequency of about 9 GHz.

Two such reflectors are mounted one at each end of the dipole with the reflecting array facing toward the balanced junction 16.

It will be appreciated that these reflectors are frequency dependent. At low frequencies toward the bottom end of the band they are substantially transparent and have little effect, while their reflecting ability increases with frequency until at the upper end of the band the cavity length is effectively shortened to the distance between the junction 16 and the reflector array 25.

An advantageous effect of the auxiliary reflector is that, while at low frequencies the reflector array itself is largely transparent, the dielectric slab is still present so increasing the effective length of the cavity as compared with the same length of air. The low frequency response is thus improved, the effective length being closer to the ideal quarter wavelength than the corresponding conventional balun.

At the upper end of the frequency range of the reflector array 25 produces an image in the end wall 29 or 31 causing mismatch. This is corrected by a layer of radar absorbent material 33, RAM so-called, which is bonded to the end walls 29 & 31. This material is proprietary and is available in various thickness and resonant frequencies. A frequency towards the upper part of the band is chosen, so making the end wall effectively opaque to an image of the reflector at the higher frequencies.

Thus the frequency band is extended in both directions.

Control of the resulting loss characteristics is dependent on a number of the above factors in combination, thus: the diameter of the array 25 affecting the reflector resonant frequency; the dielectric constant and axial length of the plate 23; the position of the reflector array 25 from the end wall; the thickness and resonant frequency of the resonant absorber layer 33.

The reflector array may be of various forms including a continuous disc (with hole). The number of legs should preferably be at least twelve but is not critical.

The arm 17 in the above embodiment is a single conductive rod but in an alternative construction may be a coaxial line, in which case the 'inners' of the two arms 15 & 17 are connected together.

FIGS. 4 & 5 show the effect on the frequency response of the modified balun. Comparing the return losses in FIG. 4 it can be seen that the losses are improved substantially more or less throughout the band and particularly at the upper end above about 6.5 GHz. Comparing the insertion losses in FIG. 5 it can be seen that there is a very significant improvement at the upper end.

Figure 6:
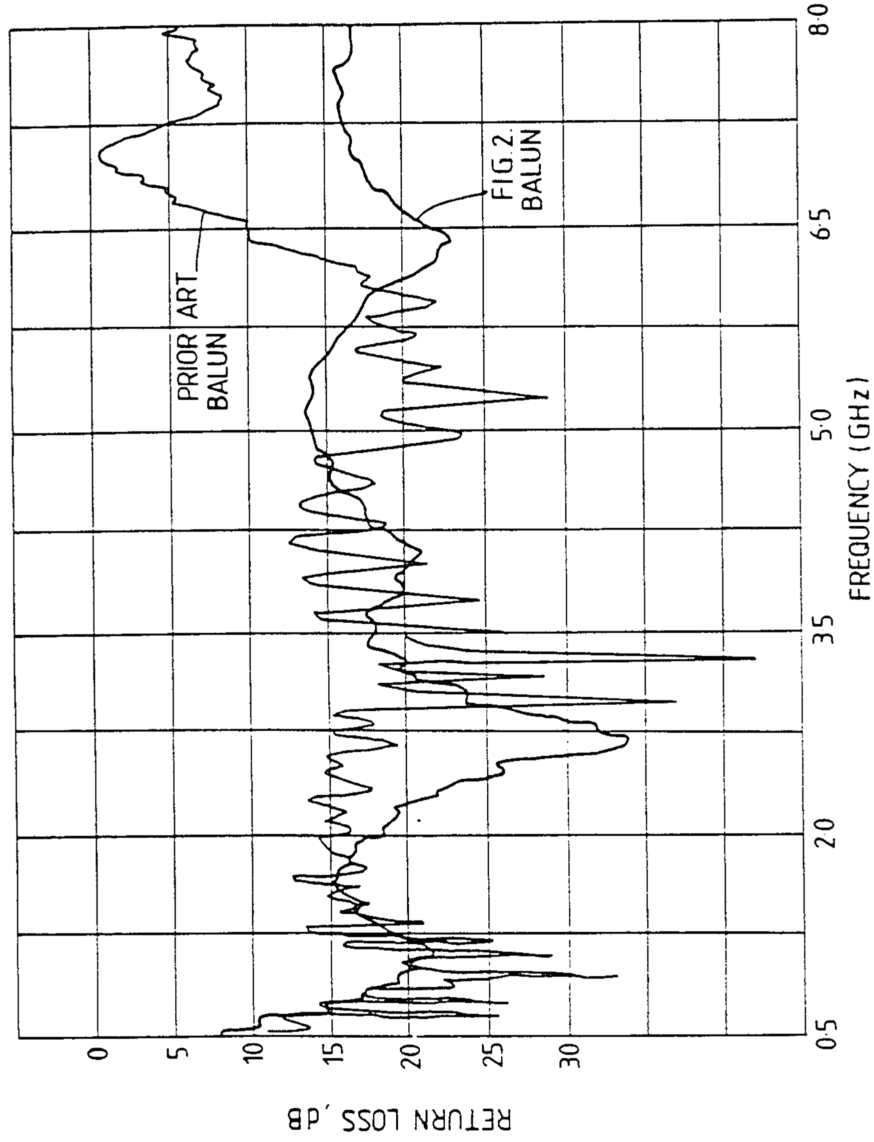
FIG. 6 shows matching characteristics for the whole antenna in the cases of FIG. 1 and FIG. 2.

FIG. 6 shows the return loss characteristics for the complete antenna assemblies of FIGS. 1 & 2.

While the improved balun has been described in relation to a cavity-backed spiral antenna, the improvement is available for any application of a microwave balun transformer. It will be appreciated that the spiral antenna, while being 'square' in the described example to improve the low frequency response, may be of conventional 'circular spiral' form. Again, while the housing 1 is square in the described embodiment, it would generally conform to the shape of the antenna and be circular for a circular spiral.

I claim:

1. A microwave balun transformer comprising:

(a) a conductive housing having opposite end walls bounding a cavity;

(b) a first terminal port at one of the end walls;

(c) a balanced line having conductors extending through the housing to provide a second terminal port;

(d) a dipole having two elongated arms extending through the cavity, and having a junction between the arms, at least one of the arms comprising a coaxial line connected to the first terminal port, the arms of the dipole being connected at said junction to the respective conductors of the balanced line; and (e) a reflector positioned close to each end of the dipole arms and extending across the cavity transverse to the dipole arms, each reflector being substantially transparent at the frequency for which the length of each dipole arm is a quarter wavelength but being a substantial reflector at higher frequencies so that the effective length of each dipole arm remains closer to a quarter wavelength over a range of frequencies.

2. A transformer according to claim 1, wherein each reflector comprises a conductive layer mounted on the front of a dielectric plate, the dielectric plate increasing the average permittivity of the cavity and thus reducing the frequency for which the effective length of each dipole arm is one half a wavelength.

3. A transformer according to claim 2 wherein each reflector comprises an array of radial conductors extending from a conductive ring embracing a respective dipole arm.

4. A transformer according to claim 1 wherein a layer of radar absorbent material is mounted on each end wall of the cavity to suppress the effect of imaging of the reflectors in the end walls.

5. In combination with a transformer according to claim 1, a microwave antenna comprising a spiral conductor array mounted on a dielectric plate which in turn forms a closure to an antenna cavity, the antenna cavity being mounted on the conductive housing, said balanced line extending through the antenna cavity to feed the spiral array.

* * * * *